US00RE43471E

(19) United States
(12) Reissued Patent
Uehara et al.

(10) Patent Number: US RE43,471 E
(45) Date of Reissued Patent: Jun. 12, 2012

(54) METHOD OF MANUFACTURING A SEMICONDUCTOR DEVICE

(75) Inventors: Ichiro Uehara, Miyazaki (JP); Kazuhiro Toshima, Kanagawa (JP); Shunpei Yamazaki, Tokyo (JP)

(73) Assignee: Semiconductor Energy Laboratory Co., Ltd., Atsugi-shi, Kanagawa-ken (JP)

(21) Appl. No.: 10/960,898

(22) Filed: Oct. 8, 2004

Related U.S. Patent Documents

Reissue of:
(64) Patent No.: 6,461,886
Issued: Oct. 8, 2002
Appl. No.: 09/852,916
Filed: May 11, 2001

(30) Foreign Application Priority Data

May 13, 2000 (JP) ..... 2000-180549

(51) Int. Cl.
*H01L 21/00* (2006.01)

(52) U.S. Cl. ..... 438/713; 438/800; 438/149

(58) Field of Classification Search ..... 438/30, 438/158, 159, 713, 800, 149
See application file for complete search history.

(56) References Cited

U.S. PATENT DOCUMENTS 5,078,771 A 1/1992 Wu
5,174,857 A * 12/1992 Sung ..... 216/48
5,242,543 A * 9/1993 Maejima et al. ..... 216/16
5,248,576 A * 9/1993 Yokoyama et al. ..... 430/7
5,334,859 A 8/1994 Matsuda
5,359,206 A 10/1994 Yamamoto et al.
5,518,860 A 5/1996 Niikura et al.
5,585,290 A 12/1996 Yamamoto et al.
5,589,962 A 12/1996 Yamamoto et al.
5,604,138 A 2/1997 Lee et al.
5,607,900 A 3/1997 Inada et al.
5,672,523 A 9/1997 Yamamoto et al.
5,719,408 A 2/1998 Yamamoto et al.

(Continued)

FOREIGN PATENT DOCUMENTS

EP 0 530 834 A1 3/1993

(Continued)

OTHER PUBLICATIONS

Office Action (Korean Application No. 2001-0025719) mailed Jul. 25, 2007 with English language translation.

(Continued)

*Primary Examiner* — Laura Menz
(74) *Attorney, Agent, or Firm* — Fish & Richardson P.C.

(57) ABSTRACT

In a patterning process of a semiconductor device having inverted stagger type TFTs, a normal photolithography step using diazo naphthoquinone (DNQ)-Novolac resin based positive photo resist is applied, and a problem of the area dependency of the photo resist pattern side wall taper angle may occur. The problem is critical for the reason of influence on variation of an etching shape in a dry-etching step. The present invention has an object to solve the above problem. In a photolithography step, which is patterning step of a semiconductor device having inverted stagger type TFTs, by adjusting a pre-bake temperature or a PEB (post-exposure-bake) temperature, and positively performing evacuation of solvent in a state of a photo resist film, the volume contraction by evacuation of solvent at the post-bake is reduced, and the problem of the area dependency of the photo resist pattern side wall taper angle is solved, which is deformation due to the volume contraction.

18 Claims, 6 Drawing Sheets

U.S. PATENT DOCUMENTS

| | | | | |
|---|---|---|---|---|
| 5,781,255 | A | 7/1998 | Yamamoto et al. | |
| 5,889,573 | A | 3/1999 | Yamamoto et al. | |
| 6,051,484 | A | 4/2000 | Morizuka | |
| 6,156,583 | A | 12/2000 | Hwang | |
| 6,221,787 | B1 | 4/2001 | Ogata | |
| 6,226,059 | B1 | 5/2001 | Yamamoto et al. | |
| 6,304,309 | B1 * | 10/2001 | Yamanaka et al. | 349/156 |
| 6,335,290 | B1 | 1/2002 | Ishida | |
| 6,461,886 | B1 * | 10/2002 | Uehara et al. | 438/30 |
| 6,534,789 | B2 | 3/2003 | Ishida | |
| 6,556,421 | B2 * | 4/2003 | Aoki et al. | 361/311 |
| 6,563,557 | B2 * | 5/2003 | Yamanaka et al. | 349/74 |
| 6,596,571 | B2 * | 7/2003 | Arao et al. | 438/163 |
| 6,709,901 | B1 * | 3/2004 | Yamazaki et al. | 438/149 |
| 6,716,681 | B2 * | 4/2004 | Wen et al. | 438/149 |
| 6,746,965 | B2 * | 6/2004 | Uehara et al. | 438/713 |
| 6,750,087 | B2 * | 6/2004 | Morita et al. | 438/151 |
| 6,806,499 | B2 * | 10/2004 | Yamazaki et al. | 257/72 |
| 6,838,696 | B2 | 1/2005 | Kobayashi et al. | |
| 6,855,957 | B1 * | 2/2005 | Yamazaki et al. | 257/72 |
| 6,900,084 | B1 * | 5/2005 | Yamazaki | 438/158 |
| 6,933,184 | B2 * | 8/2005 | Arao et al. | 438/163 |
| 7,084,017 | B2 | 8/2006 | Nakamura et al. | |
| 7,102,165 | B2 * | 9/2006 | Yamazaki | 257/59 |
| 7,102,718 | B1 * | 9/2006 | Yamazaki et al. | 349/141 |
| 7,394,097 | B2 | 7/2008 | Kobayashi et al. | |
| 7,645,648 | B2 | 1/2010 | Kobayashi et al. | |
| 7,755,088 | B2 | 7/2010 | Kobayashi et al. | |
| 2002/0016028 | A1 * | 2/2002 | Arao et al. | 438/149 |
| 2002/0022364 | A1 * | 2/2002 | Hatta et al. | 438/673 |
| 2002/0122285 | A1 * | 9/2002 | Aoki et al. | 361/311 |
| 2002/0125427 | A1 * | 9/2002 | Chand et al. | 250/306 |
| 2002/0127887 | A1 * | 9/2002 | Uehara et al. | 438/800 |
| 2002/0135720 | A1 * | 9/2002 | Yamanaka et al. | 349/122 |
| 2003/0160236 | A1 * | 8/2003 | Yamazaki et al. | 257/53 |
| 2003/0186478 | A1 * | 10/2003 | Morita et al. | 438/30 |
| 2004/0018670 | A1 * | 1/2004 | Arao et al. | 438/151 |
| 2005/0011752 | A1 * | 1/2005 | Yamazaki et al. | 204/192.15 |
| 2005/0024549 | A1 * | 2/2005 | Gotoh et al. | 349/43 |
| 2005/0041166 | A1 * | 2/2005 | Yamazaki et al. | 349/42 |
| 2005/0112889 | A1 * | 5/2005 | Inoue et al. | 438/689 |
| 2005/0205870 | A1 * | 9/2005 | Yamazaki | 257/72 |
| 2005/0221542 | A1 * | 10/2005 | Yamazaki et al. | 438/149 |
| 2007/0001171 | A1 * | 1/2007 | Yamazaki | 257/59 |

FOREIGN PATENT DOCUMENTS

| | | | |
|---|---|---|---|
| EP | 0 544 069 | A1 | 6/1993 |
| JP | 03-232274 | A | 10/1991 |
| JP | 05-152327 | A | 6/1993 |
| JP | 05-206086 | A | 8/1993 |
| JP | 06-222370 | | 8/1994 |
| JP | 06-244155 | A | 9/1994 |
| JP | 07-153965 | A | 6/1995 |
| JP | 08-087033 | A | 4/1996 |
| JP | 9-54438 | | 2/1997 |
| JP | 09-054438 | | 2/1997 |
| JP | 09-197436 | A | 7/1997 |
| JP | 09-274313 | A | 10/1997 |
| JP | 09-279367 | A | 10/1997 |
| JP | 09-288347 | A | 11/1997 |
| JP | 10-026829 | A | 1/1998 |
| JP | 10-056179 | A | 2/1998 |
| JP | 2000-047263 | A | 2/2000 |
| JP | 2000-089477 | A | 3/2000 |
| JP | 2001-339072 | A | 12/2001 |
| KR | 1997-0051899 | | 7/1997 |
| KR | 10-1999-0004786 | * | 1/1999 |
| KR | 1999-4786 | | 1/1999 |
| KR | 1999-0070241 | | 9/1999 |

OTHER PUBLICATIONS

Office Action, Japanese Application No. 2001-144035, dated Aug. 2, 2011, 14 pages with English translation.

* cited by examiner

METHOD OF MANUFACTURING A SEMICONDUCTOR DEVICE

Matter enclosed in heavy brackets [ ] appears in the original patent but forms no part of this reissue specification; matter printed in italics indicates the additions made by reissue.

TECHNICAL FIELD TO WHICH THE INVENTION BELONGS

The present invention relates to a semiconductor device having a circuit formed of thin film transistors (thereafter, referred to as TFTs) and a method of manufacturing the same. The semiconductor device includes, for example, an electro-optical device such as a liquid crystal display formed of TFTs.

More specifically, the present invention relates to a method of manufacturing a semiconductor device having inverted staggered type TFTs with a bottom gate structure, and more particularly to a photolithography for patterning, the semiconductor device.

PRIOR ART

In recent years, an active matrix liquid crystal display technology using TFTs is of great interest. Since an active matrix display is provided with a TFT switch on each pixel, a liquid crystal orientation state of TN (i.e., twisted nematic) mode is available, and it is advantageous in terms of response speed, viewing angle and contrast, compared with a passive matrix display, it is mainly used in the current liquid crystal display.

In the electro-optical device including such a liquid crystal display with the active matrix display, high definition, high aperture ratio and high reliability, along with enlarging the area of a screen have been greatly required, while low cost along with improvement of the productivity has been further greatly required. In particular, in response to the low cost requirement, an inverted stagger type TFT is widely adopted, which has a bottom gate structure having a channel forming region formed of an amorphous silicon film conventionally capable of being produced on a large area substrate with a low temperature process at 300° C. or less.

The above-mentioned inverted stagger type TFT is basically advantageous of low cost, since a low cost glass substrate and the low temperature process at 300° C. or less are employed. However, since low cost is further required, the improvement of the productivity for attaining the low cost has been considered. Since shortening the process is most effective for improving the productivity, shortening the process has been considered in the industry. Therefore, reducing a photolithography step which is a pattering step, that is, reducing the number of photo masks is considered for shortening the process.

A normal photolithography step using diazo naphthoquinone (DNQ)-Novolac resin based positive photo resist, and an etchings step such as dry etching and wet etching are applied in the patterning step to he reduced.

In the normal photolithography step consisting of a combination of the diazo naphthoquinone (DNQ)-Novolac resin based positive photo resist and a reduction projection exposure apparatus (also referred to as a stepper) which is a single wavelength (g-ray and i-ray of high-pressure mercury-vapor lamp) exposure apparatus, it has been apparent that fluctuation in taper angle of the resist pattern occurs due to variation in size of the resist pattern. Namely, the resist shape of a fine pattern (about 0.3-3 μm) is a good rectangular pattern, but in a larger pattern (about 10 μm or more), deformation in the pattern with variation in taper angle occurs on a side wall of the resist shape, and it is observed that the taper angle is reduced (see FIG. 1).

Since the above phenomenon occurs under a process condition, i.e., pre-bake temperature (90° C. for one minute), followed by PEB (post exposure bake) temperature (110° C. for three minutes) and post-bake temperature (120° C. for four minutes), in which the post-bake temperature after development is higher than the PEB temperature, the phenomenon is considered to be caused due to evacuation of residual solvent from the resist pattern at the post-bake. Also, in a photolithography step without PEB process, it is observed that deformation in the resist pattern due to volume contraction from the resist pattern at the post-bake occurs in the case of large difference between the pre-bake temperature and the post-bake temperature.

In producing the inverted stagger type TFT with a bottom gate structure, while the photolithography step without PEG process is generally adopted, it is not advantageous that as described above, deformation in the resist pattern due to volume contraction at the post-bake occurs. Since various dimensions of circuit patterns exist in a liquid crystal display, deformation in the resist pattern with variation in taper angle depending on variation in the area of the resist pattern influences the etched shape, and thus is a critical problem.

Also, for low cost and enhancement of yield, reduction of the photolithography step is required. In this case, since a plurality of thin film layers, are patterned simultaneously using the resist pattern as a mask, variation of the resist pattern side wall taper angle is a critical problem because it is observed that it also greatly influences the etched shape.

In light of the above problem, in a photolithography step which is a patterning step for a semiconductor device having an inverted stagger type TFT, a phenomenon in which the greater the dimension of the photo resist pattern is, the smaller the taper angle on the side wall is, i.e., the area dependence of the photo resist pattern side wall taper angle is worried. The problem of the area dependence of the photo resist pattern side wall taper angle is found in other companies, and the details are disclosed in Japanese Patent Application Laid-open No. Hei 09-54438.

SUMMARY OF THE INVENTION

It is an object of the present invention to provide an semiconductor device formed of inverted stagger type TFTs and a method of manufacturing the same, which can solve the above described problems.

Thus, it is an object of the present invention to solve the area dependence of photo resist pattern side wall taper angle in a photolithography step with diazo naphthoquinone (DNQ)-Novolac resin based positive photo resist. In particular, it is an object of the present invention to the area dependence of the photo resist pattern side wall taper angle in a photolithography step which is a production process of a semiconductor device having inverted stagger type TFTs.

(Means for Solving Photo Resist Pattern Deformation)

First, a description will be made of means for solving resist pattern deformation with variation in taper angle dependent on the pattern area in a photolithography step.

As described above, pattern deformation with variation of side wall taper angle of large area photo resist pattern (about 10 μm or more) occurred as shown in FIG. 1 in a photolithography step with diazo naphthoquinone (DNQ)-Novolac resin based positive photo resist. Since this pattern deformation dose not occur in fine pattern (about 3 82 m or less) formed simultaneously, it is observed that the pattern deformation is dependent on the dimension of the photo resist pattern, i.e., the area of the photo resist pattern (see FIG. 1).

The problem of the area dependence of the photo resist pattern side wall taper angle is found in other companies, and the details are disclosed in Japanese Patent Application Laid-open No. Hei 09-54438.

In patterning the photo resist pattern shown in FIG. 1, a reduction projection exposure apparatus is used as an exposure apparatus, in which a single wavelength (specifically, i-ray of an extra high-pressure mercury-vapor lamp) is used for accounting for chromatic aberration. Therefore, PEB process is generally applied between exposure and development because of adverse effect by standing wave due to a single wavelength of the exposed light. This company uses the PEB process in performing a photolithography step using the reduction projection exposure apparatus.

As described above, the photo resist pattern deformation with variation of side wall taper angle occurs in a photolithography step applying the PEB process between exposure and development, i.e., in a sequence of photo processes consisting of a photo resist coating→pre-bake (90° C. for one minute)→exposure (using the reduction projection exposure apparatus)-PEB (110° C. for three minutes)→development, and post-bake (120° C. for four minutes). In the photo process, since the photo resist pattern deformation occurs after the post-bake process (120° C. for four minutes) at glass transition temperature (about 150° C.) or less, which can be a softening point of the photo resist, it is apparent that the photo resist pattern deformation dose not occur due to thermal softening of the photo resist. Therefore, factors of the photo resist pattern deformation other than the thermal softening are discussed as described below (see FIG. 1).

In the normal photolithography step consisting of a combination of the diazo naphthoquinone (DNQ)-Novolac resin based positive photo resist and a reduction projection exposure apparatus (also referred to as a stepper) which is a single wavelength (g-ray and i-ray of high-pressure mercury,-vapor lamp) exposure apparatus, it is considered that volume contraction phenomenon in the resist pattern due to evacuation of residual solvent at the post-bake causes a pattern deformation on the side wall of large area photo resist pattern (about 10 μm or more). Accordingly, it is expected that if PEB temperature for baking the entire resist film after exposure is equal to or greater than the post-bake temperature, evacuation of solvent component at the PEB process is promoted, and evacuation of the solvent from the resist pattern at post-bake is relatively reduced.

For verifying the above expectation, the influence on the dimension of the large area resist pattern edge was measured as changing PEB temperature from 110° C. to 150° C. The dimension of the large area resist pattern edge was then measured by means of a measurement SEM (see FIGS. 2A and 2B).

FIG. 2A is a plot of PEB temperature (horizontal axis) and pattern edge width (μm). In Fill. 2B, the large area pattern is a part of a concave LSA mark and the periphery of the mark is a resist region. The exposure time was adjusted so that the line length of 0.8 μm L/S becomes substantially 0.8 μm ever, PEB condition. Focus is 0.0 μm. Referring to FIGS. 2A and 2B, the dimension of the large area resist pattern edge is Gradually decreased in response to the rise of the PEB temperature, and it was observed that it is tended to be stable at the higher PEB temperature than that close to post-bake temperature (120° C.), i.e., the pattern deformation with variation in the side wall taper angle of the large area resist pattern due to volume contraction phenomenon is reduced in a region at the higher temperature region than that close to post-bake temperature (120° C.).

In other words, since decreasing the dimension of the large area photo resist pattern edge increases the side wall taper angle of the large area photo resist pattern, which means that the taper angle becomes sharp, it is understood that in a region at the PEB temperature higher than the post-bake temperature (120° C.), the side wall taper angle of the large area photo resist pattern is large and stable (see FIGS. 2A and 2B).

Accordingly, it is demonstrated that the pattern deformation with variation in the resist taper angle in the large area photo resist pattern is effectively controlled by rising PEB temperature equal to or higher than the post-bake temperature (see FIGS. 2A and 2B).

Actually, the PEB process is a step introduced to reduce interference fringes on the post-development resist pattern side wall occurring at a single wavelength exposure by the reduction projection exposure apparatus. The PEB process may not be necessarily introduced because interference fringes on the post-development resist pattern side wall basically do not occur in exposing by means of an equivalent projection exposure apparatus capable of multi-wavelength exposure (for example, g-ray, h-ray and i-ray of an extra high-pressure mercury-vapor lamp).

In practice, in a photolithography step for an inverted stagger type TFT manufactured on a large glass substrate, since the equivalent projection exposure apparatus using multi-wavelength is used for convenience of the production, a photo process without PEB process, i.e., a photo process consisting of a sequence of photo resist coating→pre-bake→exposure→development→post-bake is generally used.

Also, in this case, if the post-bake temperature (normally, about 110-140° C.) is higher than the pre-bake temperature (normally, about 90-100° C.), evacuation of residual solvent from the resist pattern at the post-bake is accelerated and the resist pattern deformation with variation in the taper angle due to volume contraction of the resist pattern may occur depending on the difference of the temperatures.

Based on the above discussion, in the photolithography step without PEB process, deformation of the photo resist pattern shape was measured as changing the pre-bake temperature (90° C., 110° C., and 130° C. -1.5 minutes) with the post-bake temperature being fixed (140° C. -two minutes). The photo resist pattern shape obtained is observed by means of cross-section SEM, and the measured results are shown in FIGS. 3A-3C. In the measurement, MPA (Canon inc.), which is an equivalent projection exposure apparatus, is used as an exposure apparatus, and a photo resist pattern having 3 μm line is used as measurement pattern.

FIGS. 3A-3C are SEMI photographs of the resist pattern cross-section, at pre-bake temperature 90° C. (FIG. 3A), 110° C. (FIG. 3B) and 130° C. (FIG. 3C), respectively, wherein exposure is performed by means of an equivalent projection exposure apparatus using multi-wavelengths, and development and post-bake (140° C.) are directly performed without the PEB process. As seen in the figures, for the pre-bake at 90° C. and 110° C., compared with the pre-bake at 130° C., volume contraction phenomenon of the resist pattern due to evacuation of the solvent at the post-bake is large, and deformation of the resist pattern is observed. To solve the problem, the difference between the pre-bake temperature and the post-bake temperature must be 10° C. or less.

In the measurement, the large area photo resist pattern (10 μm or more) is not measured. If the large area photo resist pattern is measured, appropriate range of the pre-bake temperature would be equal to or greater than that of the post-bake temperature similarly to a measurement with the PEB process because of severer condition of the measurement in terms of deformation phenomenon occurred due to volume contraction by evacuation of solvent at the post-bake. However, if the appropriate range of the pre-bake temperature is equal to or greater than that of the post-bake temperature, it is possible that exposure property such as sensitivity is adversely affected as pre-bake temperature rises. Preferably, the post-bake temperature is not excessively reduced for adherence of the photo resist pattern to the underlying substrate. From this point, the pre-bake temperature was measured using normal photo resist pattern (3 μm line pattern) rather than the large area photo resist pattern, and the bake condition was restricted so that pre-bake temperature is within ±10° C. relative to the post-bake temperature.

From the above discussion, for controlling variation of the taper angle dependent on change in size of the resist pattern regardless of the PEB process. Generally, it is understood that evacuation of residual solvent within the resist film is preferably accelerated in the state of the resist film before patterning in the development process, because volume contraction phenomenon is reduced due to evacuation solvent at the post-bake baking only the resist pattern. Specifically, for the process with PEB process, the bake condition is restricted so that PEB temperature is equal to or greater than the post-bake temperature. On the other hand, for the process without the PEB process, the bake condition is restricted so that pre-bake temperature is equal to or within ±10° C. relative to the post bake temperature.

Accordingly, in accordance with the present invention, a solution is provided which can solve a problem of the area dependence of the photo resist pattern side wall taper angle inducing the deformation phenomenon due to volume contraction occurred by evacuation of solvent from the photo resist pattern at the post-bake.

In the photolithography step using diazo naphthoquinone (DNQ)-Novolac resin based positive photo resist without the PEB process, the deformation phenomenon due to volume contraction occurred by evacuation of solvent from the photo resist pattern at the post-bake is solved by restricting the pre-bake temperature within ±10° C. relative to the post-bake temperature.

In the photolithography step using diazo naphthoquinone (DNQ)-Novolac resin based positive photo resist with the PEB process, the deformation phenomenon due to volume contraction occurred by evacuation of solvent from the photo resist pattern at the post-bake is solved by restricting the PEB temperature so as to be equal to or higher than the post-bake temperature.

(Method of Manufacturing a Semiconductor Device)

In a method of manufacturing a semiconductor device having inverted stagger type TFTs, reduction of patterning steps is considered to reduce the overall process steps, and the present invention relates to a method of manufacturing the semiconductor device using three photo masks. In the method of manufacturing the semiconductor device, means solution for solving the area dependence of photo resist pattern side wall taper angle which is a problem of a photolithography step is described below.

A method of manufacturing a semiconductor device in accordance with the present invention includes a first step of forming a first conductive film on an insulating surface, a second step of forming a resist pattern on the first conductive film, a third step of dry-etching the first conductive film to form a first pattern, a fourth step of forming a first insulating film on the first pattern, a fifth step of forming a first semiconductor film on the first insulating film, a sixth step of forming a one conductivity type second semiconductor film on the first semiconductor film, a seventh step of forming a second conductive film on the one conductivity type second semiconductor film, an eighth step of forming a resist pattern on the second conductive film, a ninth step of dry-etching the first semiconductor film, the one conductivity type second semiconductor film, and the second conductive film to form a second pattern, a tenth step of forming a third conductive film on the second pattern, an eleventh step of forming a resist pattern on the third conductive film, and a twelfth step of etching the third conductive film to form a third pattern, It is to be noted that the third pattern formed by the twelfth step is patterned by etching not only the third conductive film but also the second pattern (formed by the ninth step).

Alternatively, a method of manufacturing a semiconductor device in accordance with the present invention comprises a first step of forming a first conductive film on an insulating film, a second step of forming a resist pattern on the first conductive film, a third step of dry-etching the first conductive film to form a gate electrode, a fourth step of forming a first insulating film on the gate electrode, a fifth step of forming a first semiconductor film on the first insulating film, a sixth step of forming a one conductivity type second semiconductor film on the first semiconductor film, a seventh step of forming a second conductive film on the one conductivity type second semiconductor film, an eighth step of forming a resist pattern on the second conductive film, a ninth step of dry-etching the first semiconductor film, the one conductivity type second semiconductor film, and the second conductive film to form a source wiring and an active layer, a tenth step of forming a third conductive film on the source wiring and the active layer, an eleventh step of forming a resist pattern on the third conductive film, and a twelfth step of etching the third conductive film to form a pixel electrode.

It is to be noted that the first insulating film formed by the fourth step is a gate insulating film. It is also to be noted that the source wiring and the active layer formed by the ninth step are formed of a laminated pattern consisting of the first semiconductor film and the one conductivity type second semiconductor film. According to a pattern forming by the twelfth step, while the pixel electrode is formed of the third conductive film, in addition, a channel region is formed of the first semiconductor film, a source region and a drain region are formed of the one conductivity type second semiconductor film, and a source electrode and a drain electrode are formed of the second conductive film.

In such a method of manufacturing a semiconductor device, each of the second, the eighth and the eleventh steps includes the steps of resist coating, pre-baking, exposing, developing, and post-baking, characterized in that difference between the pre-bake temperature and the post-bake temperature is within ±10° C.

More specifically, each of the second, the eighth and the eleventh steps includes the steps of resist coating, pre-baking, exposing, developing, and post-baking, characterized in that the pre-bake temperature is within ±10° C. relative to the post-bake temperature.

Alternatively, each of the second, the eighth and the eleventh steps includes the steps of resist coating, pre-baking, exposing, post-exposure baking, developing, and post-baking, characterized in that difference between the post-exposure bake temperature and the post-bake temperature is within ±10° C.

EMBODIMENT

The present invention relates to a structure of an inverted stagger type TFThaving a bottom gate structure and a method of manufacturing the same, characterized in that, by restricting a bake condition between a pre-bake temperature or PEB temperature and a post-bake temperature in a photolithographystep, taper angles of various dimensions of resist patterns are accurately controlled, as a result, accurately controlling shapes of various dimensions of etching patterns. Specific embodiment mode of the structure of the inverted stagger type TFT and the method of manufacturing the same in accordance with the present invention are described below with reference to FIGS. 4A-4D, FIGS. 5A-5B and FIG. 6.

Figure 1:
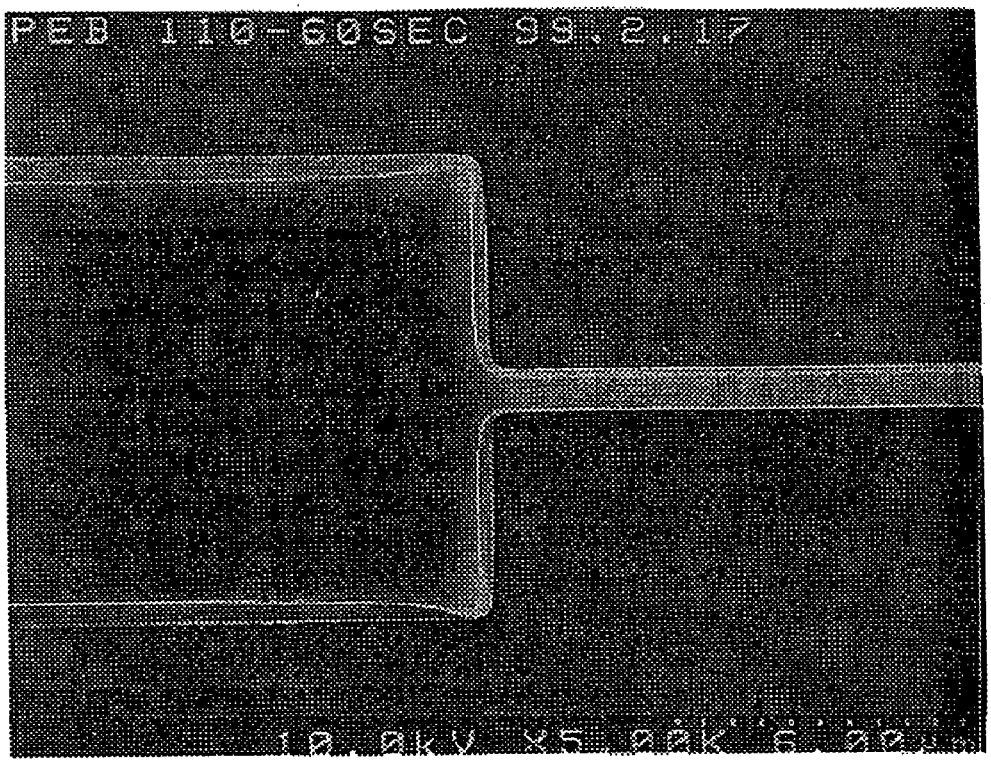
FIG. 1 An SEM photograph illustrating deformation of a resist shape in a conventional large area resist pattern.
Figure 2A:
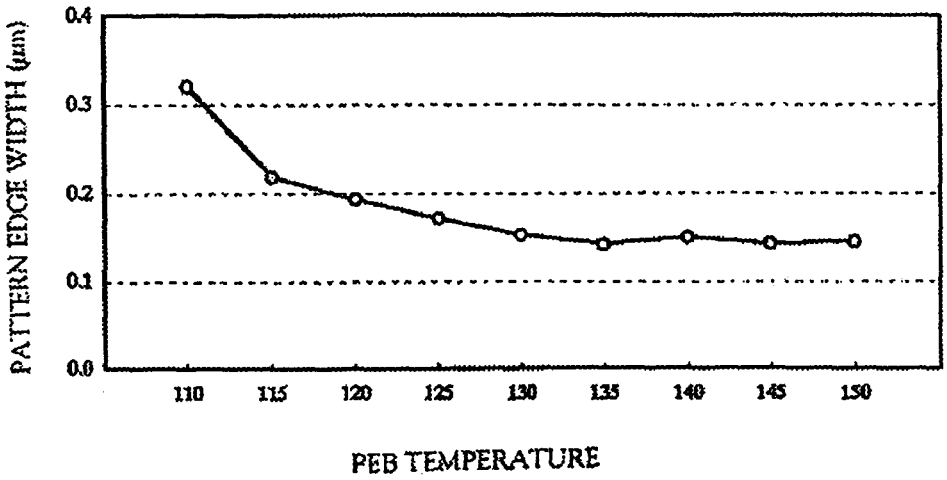
FIG. 2A A graph illustrating PEB temperature dependence of the dimension of a large area resist pattern edge in accordance with the present invention.
Figure 2B:
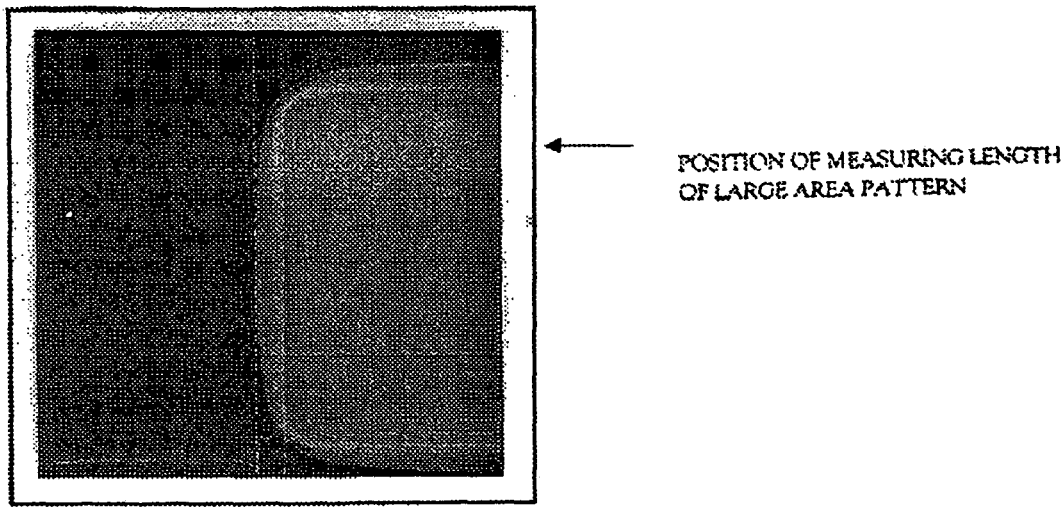
FIG. 2B An SEM photograph specifically illustrating measurement position shown in FIG. 2A.
Figure 3A:
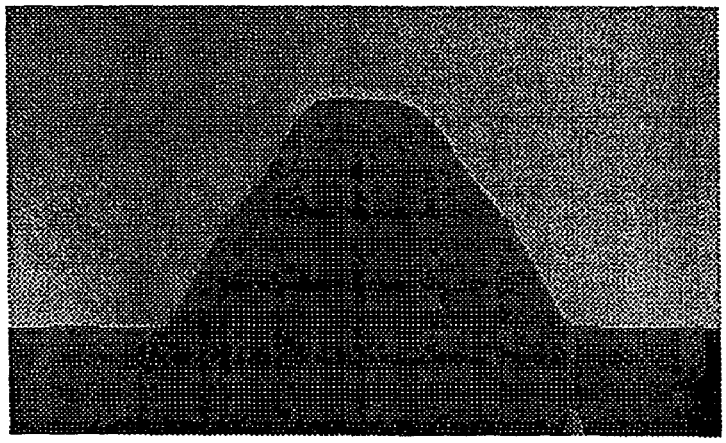
FIGS. 3A-3C SEM photographs of the resist pattern shapes in an equivalent projection exposure apparatus (MPA) in accordance with the present invention.
Figure 3B:
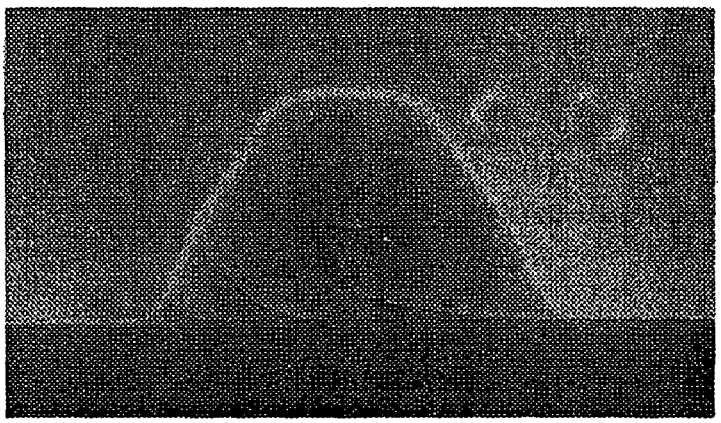
Figure 3C:
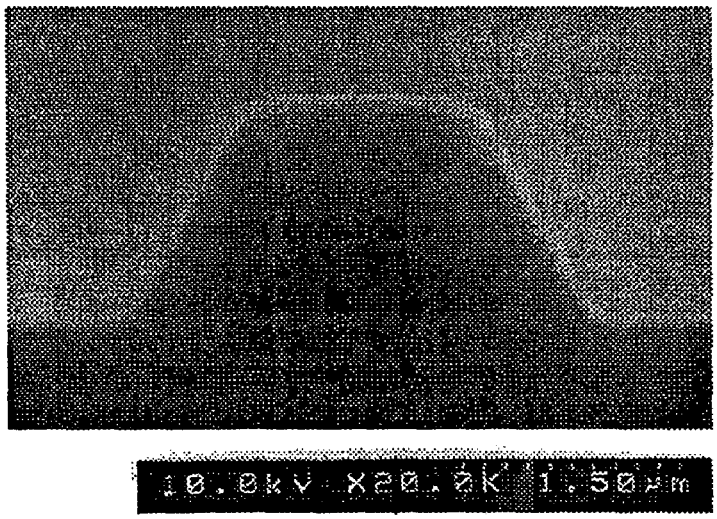
Figures 4A, 4B, 4C, 4D:
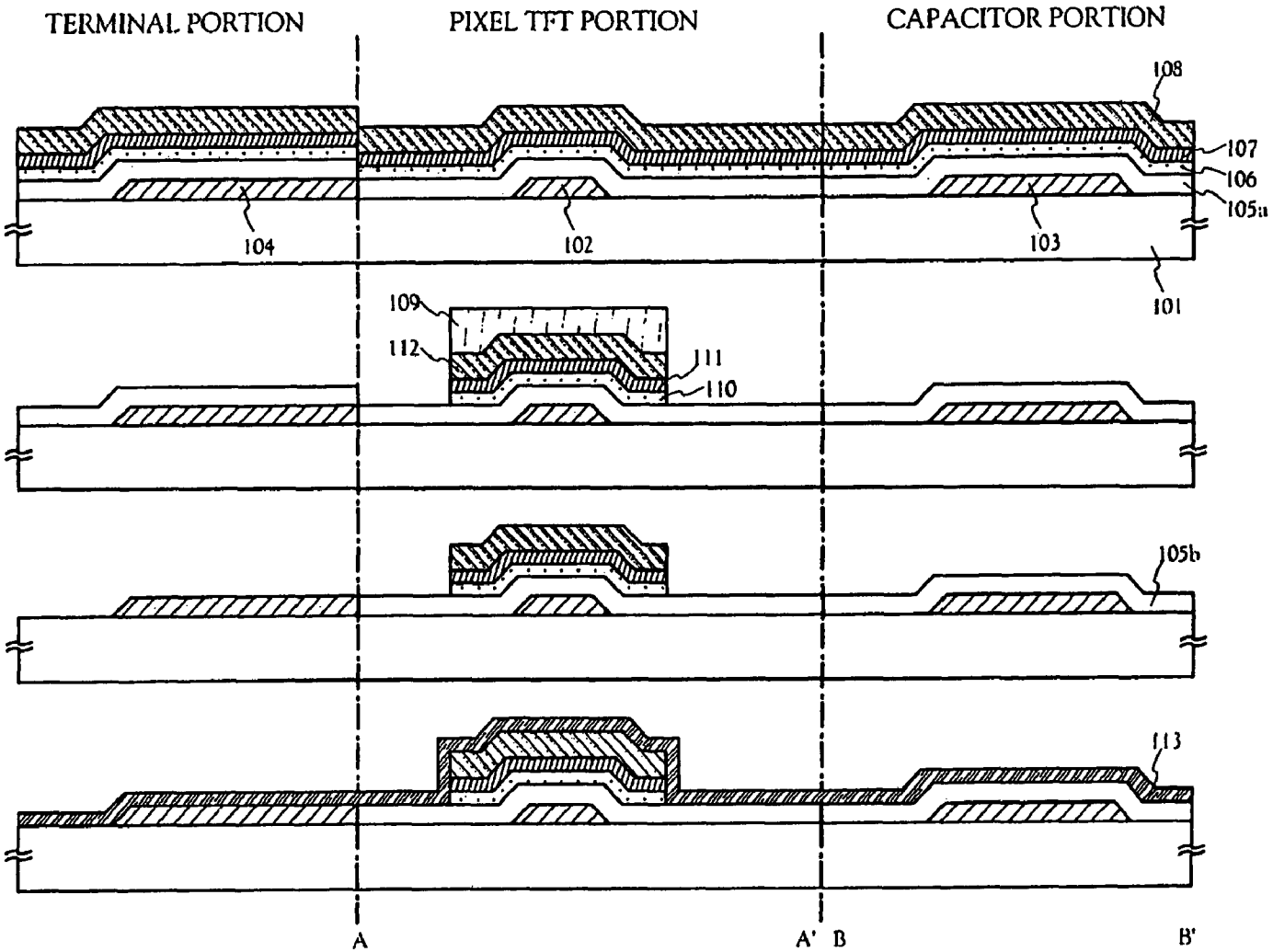
FIGS. 4A-4D Cross-sectional views illustrating the structure of an inverted stagger type TFT and a method of manufacturing the same in accordance with the present invention.
Figures 5A, 5B:
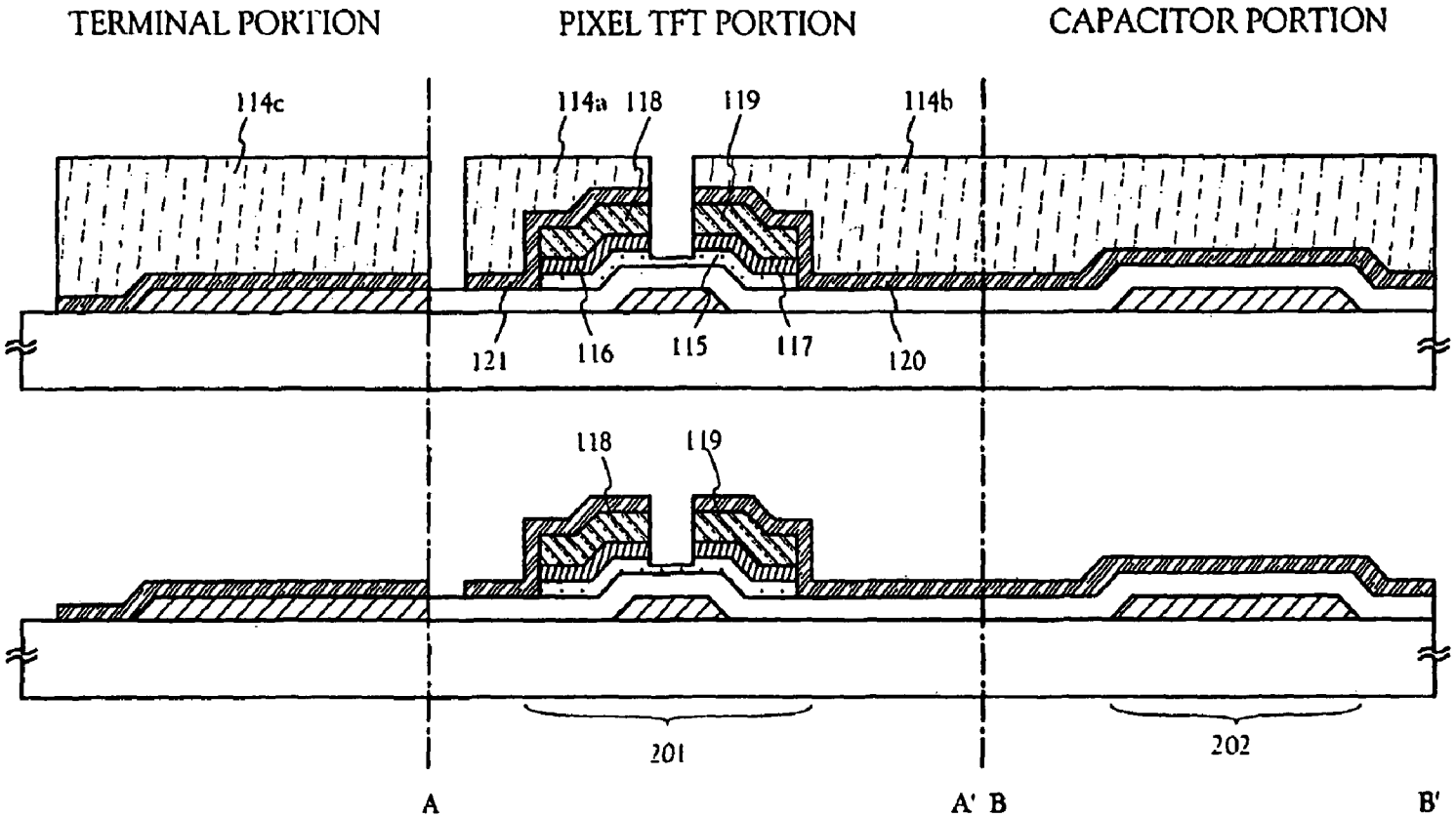
FIGS. 5A and 5B Cross-sectional views illustrating the structure of an inverted stagger type TFT and a method of manufacturing the same in accordance with the present invention.
Figure 6:
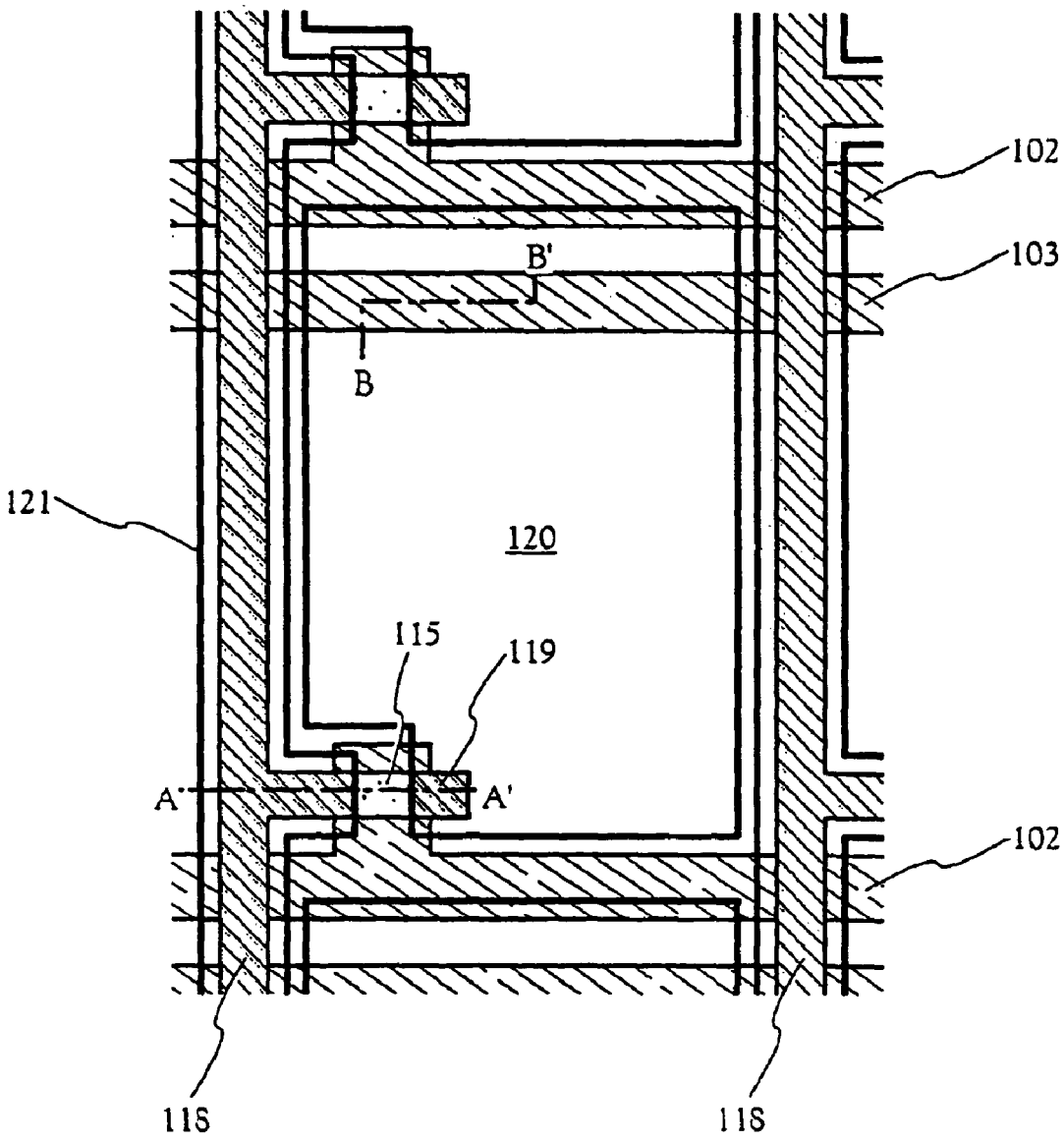
FIG. 6 A top view illustrating the structure of a pixel region in an active matrix liquid crystal display device having the inverted stagger type TFTs.

It is to be noted that FIGS. 4A-4D and FIGS. 5A-5B are cross-sectional views illustrating a manufacturing steps of an active matrix liquid crystal display device, and FIG. 6 is a top view illustrating configuration of a pixel region in the active matrix liquid crystal display device. The cross-sectional views of FIGS. 4A-4D and FIGS. 5A-5B are taken along a line A-A' and a line B-B' in FIG. 6, respectively. In FIGS. 4A-4D and FIGS. 5A-5B, a terminal portion, a pixel TFT portion and a capacitor portion are shown from the left side.

At first, a first conductive film (not shown) used as a (gate electrode material is deposited on the overall surface of an insulating transparent substrate 101such as a glass substrate by sputtering or the like (a first step). The first conductive film (not shown) is used as a material for forming a gate wiring (including a gate electrode), a capacitor wiring (including a capacitor electrode) and the others, and preferably made from a low-resistance metal, such as Al (aluminum). However, since Al alone has problems such as less heat-resistance and susceptibility to corrosion, the first conductive film is generally made of a laminate film consisting of a low-resistance metal and a heat-resistant material. Included in the laminated film are a two-layer structure of a low-resistance material (e.g., Al) and a heat-resistant material, and a three-layer structure in which a low-resistance material is sandwiched between two heat-resistant material, i.e., a three-layer structure consisting of a heat-resistant material (e.g., Al)/ a low resistance material/a heat-resistant material (see FIG. 4A).

Generally used as a low resistance material is a material including Al as its principal component added with Sc (scandium), Ti (titanium), Cu (copper), Si (silicon) or the like at about 0.01-5%. On the other hand, used as a heat-resistant material is a high-melting metal such as Ti (titanium), Ta (tantalum), W (tungsten), Mo (molybdenum), Cr (chromium), or the like; a metal silicide which is a compound of the high-melting metal and silicon; or a metal nitride which is a compound of the high-melting metal and nitrogen. In this embodiment mode, the first conductive film (not shown) consisting of Ti (50 μm thick)/Al (200 nm thick)/Ti (50 nm thick) was deposited by sputtering (see FIG. 4A).

After forming the conductive layer on the overall surface of the transparent substrate 101, a resist mask is formed by a first photolithography step (a second step) In the photolithography step with PEB process, the bake condition is restricted so that PEB temperature is equal to or higher than the post-bake temperature, on the other hand, in the photolithography step without PEB process, the bake condition is restricted so that the pre-bake temperature is equal to the post-bake temperature or difference between the pre-bake temperature and the post-bake temperature is within about 10° C. Thus a resist mask (not shown) is formed having a taper angle accurately controlled (see FIG. 4A).

In this embodiment mode, the photolithography step without PEB process is applied and the bake condition is restricted so that the pre-bake temperature is within ±10° C. relative to the post-bake temperature. Therefore, the problem of the area dependency of the photo resist pattern side wall taper angle is solved which is deformation phenomenon due to the volume contraction occurred by evacuation of solvent at the post-bake.

Next, wiring and electrodes (a gate wiring 102 including a gate electrode, a capacitor wiring 103, and a terminal 104) are formed by etching out and then removing the resist mask (not shown) (a third step). In this case, the etching is performed so that a forward taper portion is formed at the end of the grate wiring 102 (see FIG. 4A).

Since little variation of the photo resist pattern side wall taper angle occurs in the taper etching shape of each wiring such as the gate wiring 102, a stable taper etching shape without variation is obtained (see FIG. 4A).

Next, a gate insulating film 105a which is formed of a silicon oxide film, a silicon oxide nitride film or a silicon nitride film having a thickness of 50-200 nm is deposited by plasma CVD or sputtering (a fourth step). In this embodiment, the gate insulating film 105a formed of a silicon nitride film having a thickness of 150 nm was deposited by plasma CVD (see FIG. 4A).

Next, a first amorphous semiconductor film 106 having a thickness of 50-200 nm is deposited on the gate insulating film 105a by plasma CVD or sputtering (a fifth step). In the embodiment mode, the first amorphous semiconductor film 106 formed of an amorphous silicon film and having the thickness of 100 nm was deposited by sputtering (see FIG. 4A).

Next, a second amorphous semiconductor film 107 having a thickness of 20-80 nm, containing one conductivity type (n-type or p-type) impurity element, is deposited by plasma CVD or sputtering (a sixth step). In this embodiment mode, the second amorphous semiconductor film 107 formed of all amorphous silicon film and having a thickness of 50 nm was deposited by sputtering, using a silicon target containing P (phosphorus) element as n-type impurity (see FIG. 4A).

Next, a second conductive film 108 made from metal material is deposited by sputtering (a seventh step). Any metal material having ohmic contact characteristics to the underlying second amorphous semiconductor film 107 is non-limited used as material of the second conductive film 108. For example, used may be a single-layer film formed of a single element or any alloys made from a plurality of elements, such as Al (aluminum), Cr (chromium), Ta (tantalum), and Ti (titanium), and a laminated layer consisting of the single layer film. In the embodiment mode, the second conductive film 108 having a three-layer structure consisting of Ti (100 nm thick),/Al (350 nm thick)/Ti (100 nm thick) was deposited by sputtering (see FIG. 4A).

In this way, the gate insulating film 105a having 50-200 nm thickness, the first amorphous semiconductor film 106 having 50-200 nm thickness, the second amorphous semiconductor film 107 having 20-80 nm thickness containing one conductivity type (n-type or p-type) impurity element, and the second conductive film 108 made from metal material are sequentially deposited. As described above, any metal material having ohmic contact characteristics to the second amorphous semiconductor film 107 is non-limitedly used as material of the second conductive film 108 (see FIG. 4A).

Next, a resist mask 109 with a taper angle being accurately controlled is formed by a second photolithography step (an eighth step), and then a wiring 112 (in the subsequent step, becoming a source wiring and a drain electrode) is formed by etching (a ninth step). At this point, the second conductive film 108, the second amorphous semiconductor film 107 containing an impurity element imparting n-type, and the first amorphous semiconductor film 106 are sequentially etched by using the resist mask 109 as a mask, and in a pixel TFT portion, the wiring 112 consisting of the second conductive film 108, the second amorphous semiconductor film 111 containing the impurity element imparting n-type, and the first amorphous semiconductor film 110 are sequentially formed (see FIG. 4B).

In the embodiment, the second conductive film 108 having a three-layer structure consisting of Ti (100 nm thick)/Al (350 nm thick)/Ti (100 nm thick) is dry-etched by using the mixed gas of $SiCl_4$, $Cl_2$, and $BCl_3$ as dry etching gas, and the second amorphous semiconductor film 107 and the first amorphous semiconductor film 106 are dry-etched by using the mixed gas of $CF_4$ and $O_2$. In this case, the gate insulating film 105a in the capacitor portion and the terminal portion remains without being dry-etched.

In the dry etching step, since a laminated pattern consisting of the wiring 112 for forming a source and a drain electrodes, the second amorphous semiconductor film 111 for forming a source and a drain regions, and the first amorphous semiconductor film 110 for forming a channel region is dry-etched by using the photo resist mask 109 with little variation of the side wall taper angle as a mask, a stable etching shape can be obtained.

Next, after removing the resist mask 109, a resist mask (not shown) is formed using a shadow mask, and an insulating film 105b is formed by selectively removing a portion of the insulating film 105a, which covers a pad portion of the terminal portion. Thereafter, the resist mask (not shown) is removed (see FIG. 4C).

Next, a third conductive film 113 formed of a transparent conductive film is deposited overall thereon (a tenth step). Material of the third conductive film 113 includes indium oxide ($In_2O_3$), indium oxide-tin oxide alloy ($In_2O_3$—$SnO_2$: hereafter referred to as ITO) and the others (see FIG. 4D).

In the embodiment mode, the third conductive film 113 made of ITO film having a thickness of 100 nm was deposited by sputtering.

Next, photo resist masks 114a-114c with taper angle being accurately controlled are formed by a third photolithography step (an eleventh step) (see FIG. 5A).

In the embodiment, the photolithography without PEB process is applied as well as in the second step and the eighth step, and the bake condition is restricted so that the pre-bake temperature is within ±10° C. relative to the post-bake temperature. Therefore, the problem of the area dependency of the photo resist pattern side wall taper angle is solved which is deformation phenomenon due to the volume contraction occurred by evacuation of solvent at the post-bake.

Moreover, a first amorphous semiconductor film 115; a source region 116 and a drain region 117; a source electrode 118 and a drain electrode 119; and a pixel electrode 120 are formed by etching. In the third photolithography step, the third conductive film 113 is patterned, while an opening is formed by etching out a portion of the wiring 112, a portion of the second amorphous semiconductor film 111 containing an impurity element imparting n-type, and a portion of the first amorphous semiconductor film 110. The bottom of the opening reaches the first amorphous semiconductor film 110, so that the first amorphous semiconductor film 115 having a concave portion is formed. The opening divides the wiring 112 into the source electrode (source wiring) 118 and the drain electrode 119, and the second amorphous semiconductor film 111 containing an impurity element imparting n-type is separated into the source region 116 and the drain region 117 (see FIG. 5A).

In the above etching step, wet-etching is used to etch the third conductive film 113. In the wet-etching, generally, an organic acid (about 3.4% solution: ITO-04 etchant), a mixture of nitric acid and hydrochloric acid, and ferric chloride solution are used as etchant. In the embodiment, the third conductive film (ITO film) 113 is selectively wet-etched by using the organic acid (about 3.4% solution: ITO-04N etchant). On the other hand, dry-etching is applied for the laminated film consisting of the wiring 112/ the second amorphous semiconductor film 111/ the first amorphous semiconductor film 110. In the embodiment, the wiring 112 for forming(y the source and, the drain electrodes having a three-layer structure consisting of Ti (100 nm thick)/Al (350 nm thick)/Ti (100 nm thick) was dry-etched using chlorine-based mixed gas ($SiCl_4$, $Cl_2$, and $BCl_3$), while the second amorphous semiconductor film 111 for forming the source and drain regions consisting of an amorphous silicon film having 50 nm thickness containing P (phosphorus) element, and the first amorphous semiconductor film 110 for forming a channel region consisting of an amorphous silicon film having 100 nm thickness were dry-etched using fluorine-based gas ($CF_4$ and $O_2$.).

The etching shapes of the source electrode 118, the drain electrode 119, the source region 116, the drain region 117 and the others formed by the dry-etching step (except for wet-etching) are stable because of little variation of the photo resist pattern side wall taper angle.

A third conductive film 121 in contact with the source electrode (source wiring) 118 plays a role to cover the source electrode (source wiring) 118 and prevent electro statics from occurring by rubbing in the subsequent manufacturing steps. Also, in the third photolithography step, a storage capacitor 202 is formed with the capacitor wiring 103 and the pixel electrode 120using the insulating film 105b in the capacitor portion as dielectric. In the third photolithography step, a third conductive film remains which is formed of a transparent conductive film covered with a resist mask 114c and formed on the terminal portion. Next, the resist masks 114a-114c are removed (see FIG. 5B).

A plane configuration of a pixel region in the active matrix liquid crystal display device formed on the basis of the above manufacturing steps is shown in FIG. 6. The above manufacturing steps of the active matrix liquid crystal display device (FIGS. 4A-4D and FIGS. 5A-5B) is shown in cross-sectional views taken along the line of A-A' (corresponding to the pixel TFT portion) and B-B' (corresponding to the capacitor portion) in FIG. 6.

In the pixel region shown in FIG. 6, a plurality of gate wirings 102 positioned in parallel with each other and a plurality of source electrodes (source wirings) 118 each orthogonal to each of the gate wirings 102 are formed, and the pixel electrode 120 is provided in a region surrounded with the gate wiring 102 and the source electrode (source wiring) 118. The third conductive film 121, which is a transparent electrode wiring formed simultaneously with the pixel electrode 120, is provided so as to overlap the source electrode (source wiring) 118, and plays a role to prevent electro statics from occurring by rubbing in the subsequent step. In the embodiment, while the third conductive film 121 overlaps the source electrode (source wiring,) 118, the third conductive film 121 may not be formed.

Moreover, the capacitor wiring 103 is provided adjacent to and in parallel with the gate wiring 102. The capacitor wiring (including the capacitor electrode) 103 is provided in each of all pixels, the storage capacitor 202 is formed using a gate insulating film 104b between the capacitor wiring 103 and the pixel electrode 120 as dielectric. In the intersection of the gate wiring 102 and the source electrode (source wiring) 118, an inverted stagger type n-channel TFT 201 is formed which functions as a switching element (see FIG. 6).

In the embodiment, in the manufacturing process of the active matrix liquid crystal display device having inverted stagger type TFTs, a photolithography step using diazo naphthoquinone (DNQ)-Novolac resin based positive photo resist without PEB process is applied, and the bake condition is restricted so that the pre-bake temperature is within ±10° C. relative to the post-bake temperature. Therefore, an excellent photo resist pattern is formed without deformation phenomenon due to volume contraction occurred by evacuation of solvent at the post-bake. Since no deformation phenomenon occurs due to volume contraction, it is characterized in that the photo resist pattern has no problem of the area dependency of the photo resist pattern side wall taper angle.

As described above, the inverted stagger type TFT having the bottom gate structure of the present invention is manufactured using photo masks three times, and thus, it is characterized in that low-cost and improvement of yield are achieved. In the photolithography step using the photo mask with the PEB process, the bake condition is restricted so that the PEB temperature is equal to or higher than the post-bake temperature, while without the PEB process, the bake condition is restricted so that the pre-bake temperature is equal to or within ±10° C. relative to the post-bake temperature, so that the resist pattern can be formed with the taper angle being accurately controlled, thereby obtaining the etching pattern accurately controlled. Advantages of the present invention having characteristics described above arc recited below.

(Advantage 1)

In the manufacturing process of the semiconductor device having inverted stagger type TFTs, for the case of applying a photolithography step using diazo naphthoquinone (DNQ)-Novolac resin based positive photo resist without the PEB process, the bake condition is restricted so that the pre-bake temperature is within ±10° C. relative to the post-bake temperature, while for a photolithography step with the PEB process, the bake condition is restricted so that the PEB temperature is equal to or higher than the post-bake temperature. By such a bake condition restriction, a problem of the area dependency of the photo resist pattern side wall taper angle can be solved which is deformation phenomenon due to the volume contraction occurred by evacuation of solvent at the post-bake.

(Advantage 2)

In the photolithography step which is a manufacturing process of the semiconductor device having inverted stagger type TFTs, since the problem of the area dependency of the photo resist pattern side wall taper angle can be solved which is deformation phenomenon due to the volume contraction occurred by evacuation of solvent at the post-bake, a stable etching shape independent on the pattern area can be achieved in the subsequent dry-etching step. Especially, since in the production process of the semiconductor device, a plurality of laminated layer films are dry-etched in a batch, variation of the photo resist pattern side wall taper angle might sensitively influence the dry-etching shape. Accordingly, stabilization of the photo resist pattern side wall taper angle may advantageously affect stabilization of the etching shape.

(Advantage 3)

In the dry-etching step of the manufacturing process of the semiconductor device having inverted stagger type TFTs, since a stable etching shape independent on the pattern area can be achieved, improvements of both quality and yield of the semiconductor device are advantageously achieved.

(Advantage 4)

In the manufacturing process of the semiconductor device having inverted stagger type TFTs, since it is intended to reduce the manufacturing steps by reducing the number of photo masks, both yield and productivity are also improved.

What is claimed is:

1. A method of manufacturing a semiconductor device, said method comprises the steps of:

forming a first conductive film on an insulating surface;

forming a first photo resist pattern on the first conductive film;

dry-etching the first conductive film to form a first pattern;

depositing a first insulating film on the first pattern;

depositing a first semiconductor film on the first insulating film;

depositing a one conductivity type second semiconductor film on the first semiconductor film;

depositing a second conductive film on the one conductivity type second semiconductor film;

forming a second photo resist pattern on the second conductive film;

dry-etching the first semiconductor film, the one conductivity type second semiconductor film, and the second conductive film to form a second pattern;

depositing a third conductive film on the second pattern;

forming a third photo resist pattern on the third conductive film; and etching the third conductive film and the second pattern to form a third pattern, each of the steps of forming the first, the second and the third photo resist patterns comprising the steps of[.]:

coating a photo resist;

performing a pre-bake *after coating the photo resist*;

performing an exposure *after performing the pre-bake*;

performing a development *after the exposure*; and performing a post-bake *after the development*, wherein a pre-bake temperature is within ±10° C., relative to a post-bake temperature.

2. A method of manufacturing a semiconductor device having inverted stagger type thin-film transistors, said method comprises the steps of:

depositing a first conductive film on an insulating surface;

forming a first photo resist pattern on the first conductive film;

dry-etching the first conductive film to form a gate electrode;

depositing a gate insulating film on the gate electrode;

depositing a first semiconductor film on the gate insulating film;

depositing a one conductivity type second semiconductor film on the first semiconductor film;

depositing a second conductive film on the one conductivity-type second semiconductor film;

forming a second photo resist pattern on the second conductive film;

dry-etching the first semiconductor film, the one conductivity type second semiconductor film and the second conductive film to form a laminated film comprising the first semiconductor film, the one conductivity type second semiconductor film and the second conductive film;

depositing a third conductive film on the laminated film pattern;

forming a third photo resist pattern on the third conductive film;

etching the third conductive film to form a pixel electrode; and dry-etching the laminated film to form a channel region from the first semiconductor film, to form a source region and a drain region from the one conductivity type second semiconductor film and to form a source electrode and a drain electrode from the second conductive film, each of the steps of forming the first, the second and the third photo resist patterns comprising the steps of[.]:

coating a photo resist;

performing a pre-bake *after coating the photo resist*;

performing an exposure *after performing the pre-bake*;

performing a development *after performing the exposure*; and performing a post-bake *after performing the development*, wherein a pre-bake temperature is within ±10° C. relative to a post-bake temperature.

3. A method of manufacturing[,] a semiconductor device according[,] to claim 1, wherein the step of performing[,] the exposure comprises performing an exposure using a multi-wavelength light.

4. A method of manufacturing a semiconductor device according to claim 1, wherein the step of performing the exposure comprises performing an exposure using an equivalent projection exposure apparatus.

5. A method of manufacturing a semiconductor device, said method comprises the steps of:

depositing a first conductive film on an insulating surface;

forming a first photo resist pattern on the first conductive film;

dry-etching the first conductive film to form a first pattern;

depositing a first insulating film on the first pattern;

depositing a first semiconductor film on the insulating the insulating film;

depositing a one conductivity type second semiconductor film on the first semiconductor film;

depositing a second conductive film on the one conductivity type second semiconductor film;

forming a second photo resist pattern on the second conductive film;

dry-etching the first semiconductor film, the one conductivity type second semiconductor film, and the second conductive film to form a second pattern;

depositing a third conductive film on the second pattern;

forming a third photo resist pattern on the third conductive film; and etching the third conductive film and the second pattern to form a third pattern, each of the steps of forming the first, the second and the third photo resist patterns comprising the steps of:

coating a photo resist;

performing a pre-bake *after coating the photo resist*;

performing an exposure *after performing the pre-bake*;

performing a post-exposure bake *after performing the exposure*;

performing a development *after performing the post-exposure bake*; and performing a post-bake *after performing the development*, wherein a post-exposure bake temperature is equal to or greater than a post-bake temperature.

6. A method of manufacturing a semiconductor device having inverted stagger type thin-film transistors, said method comprises the steps of:

depositing a first conductive film on an insulating surface;

forming a first photo resist pattern on the first conductive film;

dry-etching the first conductive film to form a gate electrode;

depositing a gate insulating film on the gate electrode;

depositing a first semiconductor film on the gate insulating film;

depositing a one conductivity type second semiconductor film on the first semiconductor film;

depositing a second conductive film on the one conductivity type second semiconductor film;

forming a second photo resist pattern on the second conductive film;

dry-etching the first semiconductor film, the one conductivity type second semiconductor film and the second conductive film to form a laminated film comprising the first semiconductor film, the one conductivity type second semiconductor film and the second conductive film;

depositing a third conductive film on the laminated film;

forming a third photo resist pattern on the third conductive film;

etching the third conductive film to form a pixel electrode; and dry-etching the laminated film to form a channel region from the first semiconductor film, to form a source region and a drain region from the one conductivity type second semiconductor film and to form a source electrode and a drain electrode from the second conductive film, each of the steps of forming the first, the second and the third photo resist patterns comprising the steps of[;]:

coating a photo resist;

performing a pre-bake *after coating the photo resist*;

performing an exposure *after performing the pre-bake*;

performing a post-exposure bake *after performing the exposure*;

performing a development *after performing the post-exposure*; and performing a post-bake *after performing the development*, wherein a post-exposure bake temperature is equal to or higher than a post-bake temperature.

7. A method of manufacturing a semiconductor device according to claim 5, wherein the step of performing the exposure comprises performing an exposure using a single-wavelength light.

8. A method of manufacturing a semiconductor device according to claim 5, wherein the step of performing the exposure comprises performing an exposure using a reduction projection exposure apparatus.

9. A method of manufacturing a semiconductor device according to claim 2, wherein the step of performing the exposure comprises performing an exposure using a multi-wavelength light.

10. A method of manufacturing a semiconductor device according to claim 2, wherein the step of performing the exposure comprises performing an exposure using an equivalent projection exposure apparatus.

11. A method of manufacturing a semiconductor device according to claim 6, wherein the step of performing the exposure comprises performing an exposure using a single-wavelength light.

12. A method of manufacturing a semiconductor device according to claim 6, wherein the step of performing the exposure comprises performing an exposure using a reduction projection exposure apparatus.

*13. A method of manufacturing a semiconductor device, said method comprising the steps of:*

*forming a conductive film on an insulating surface;*

*forming a photo resist on the conductive film;*

*pre-baking the photo resist at a first temperature;*

*performing an exposure to the photo resist after pre-baking the photo resist;*

*performing a development after the exposure;*

*post-baking the photo resist at a second temperature after the development; and*

*etching the conductive film by using the post-baked photo resist to form a wiring having a taper portion,*

*wherein the first temperature is within ±10° C. relative to the second temperature.*

*14. A method of manufacturing a semiconductor device according to claim 13, wherein the step of performing the exposure comprises performing an exposure using a multi-wavelength light.*

*15. A method of manufacturing a semiconductor device according to claim 13, wherein the step of performing the exposure comprises performing an exposure using an equivalent projection exposure apparatus.*

*16. A method of manufacturing a semiconductor device, said method comprising the steps of:*

*forming a conductive film on an insulating surface;*

*coating a photo resist on the conductive film;*

*pre-baking the photo resist at a first temperature;*

*performing an exposure to the pre-baked photo resist;*

*performing a post-exposure bake to the photo resist at a second temperature;*

*performing a development to the post-exposure baked photo resist;*

*post-baking the developed photo resist at a third temperature; and*

*etching the conductive film by using the post-baked photo resist to form a wiring having a taper portion,*

*wherein the second temperature is equal to or greater than the third temperature.*

*17. A method of manufacturing a semiconductor device according to claim 16, wherein the step of performing the exposure comprises performing an exposure using a single-wavelength light.*

*18. A method of manufacturing a semiconductor device according to claim 16, wherein the step of performing the exposure comprises performing an exposure using a reduction projection exposure apparatus.*

* * * * *

UNITED STATES PATENT AND TRADEMARK OFFICE

CERTIFICATE OF CORRECTION

PATENT NO. : RE43,471 E
APPLICATION NO. : 10/960898
DATED : June 12, 2012
INVENTOR(S) : Ichiro Uehara, Kazuhiro Toshima and Shunpei Yamazaki It is certified that error appears in the above-identified patent and that said Letters Patent is hereby corrected as shown below:

In the Specification

Column 1, line 58, replace “etchings” with --etching--;

Column 1, line 59, replace “he” with --be--;

Column 3, line 1, replace “82 m” with --$\mu$m--;

Column 3, line 57, replace “Fill” with --Fig--;

Column 3, line 60, replace “ever,” with --every--;

Column 3, line 63, replace “Gradually” with --gradually--;

Column 4, line 52, replace “SEM1” with --SEM--;

Column 7, line 23, replace “TFThaving” with --TFT having--;

Column 7, lines 26-27, replace “photolithographystep” with --photolithography step--;

Column 7, line 43, replace “(gate” with --gate--;

Column 7, line 45, replace “101such” with --101 such--;

Column 8, line 4, replace “$\mu$m” with --nm--;

Column 8, line 30, replace “grate” with --gate--;

Column 8, line 54, replace “all” with --an--;

Column 10, line 22, replace “ITO-04” with --ITO-04N--;

Column 10, line 30, replace “forming(y” with --forming--;

Signed and Sealed this
Twenty-ninth Day of October, 2013

Teresa Stanek Rea
*Deputy Director of the United States Patent and Trademark Office*

Column 10, line 31, after “and” delete “,”;

Column 10, line 52, replace “120using” with --120 using--;

Column 11, line 48, replace “arc” with --are--.